United States Patent
Song et al.

(10) Patent No.: US 10,971,694 B2
(45) Date of Patent: Apr. 6, 2021

(54) ORGANIC LIGHT EMITTING DIODE DISPLAY DEVICE

(71) Applicant: LG Display Co., Ltd., Seoul (KR)

(72) Inventors: Ki-Wook Song, Paju-si (KR); Jung-Soo Park, Paju-si (KR); Min Yun, Paju-si (KR); Yong-Hwan Kim, Paju-si (KR); Tae-Woo Jeon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/687,371

(22) Filed: Nov. 18, 2019

(65) Prior Publication Data
US 2020/0161580 A1  May 21, 2020

(30) Foreign Application Priority Data

Nov. 20, 2018 (KR) .................. 10-2018-0143448

(51) Int. Cl.
*H01L 51/50* (2006.01)
(52) U.S. Cl.
CPC ...... *H01L 51/5044* (2013.01); *H01L 51/5056* (2013.01); *H01L 51/5072* (2013.01); *H01L 51/5088* (2013.01); *H01L 51/5092* (2013.01); *H01L 2251/558* (2013.01)
(58) Field of Classification Search
CPC ............... H01L 51/5044; H01L 51/504; H01L 51/5036; H01L 51/5012
See application file for complete search history.

(56) References Cited

U.S. PATENT DOCUMENTS

| | | | |
|---|---|---|---|
| 2010/0096622 A1* | 4/2010 | Iizumi | H01L 51/5278 257/40 |
| 2010/0123150 A1* | 5/2010 | Anandan | H01L 27/3209 257/98 |
| 2011/0121320 A1* | 5/2011 | Pieh | H01L 51/5036 257/79 |
| 2012/0098011 A1* | 4/2012 | Choi | H01L 27/3209 257/98 |
| 2013/0069077 A1* | 3/2013 | Song | H01L 51/5278 257/76 |

(Continued)

FOREIGN PATENT DOCUMENTS

| | | | |
|---|---|---|---|
| CN | 107611276 A | * | 1/2018 |
| KR | 10-2013-0070771 A | | 6/2013 |
| KR | 10-2015-0002249 A | | 1/2015 |

*Primary Examiner* — Michele Fan
(74) *Attorney, Agent, or Firm* — Seed Intellectual Property Law Group LLP

(57) ABSTRACT

Organic light emitting diode display devices are provided. In at least one embodiment, an organic light emitting diode display device includes a first electrode; a first stack on the first electrode and the first stack is configured to emit a blue colored light; a first charge generating layer on the first stack; a second stack on the first charge generating layer and the second stack is configured to emit a red colored light and a yellow-green colored light; and a second electrode on the second stack. The second stack includes: a red-yellow-green emitting material layer including a yellow-green host, a yellow-green dopant and a red dopant; and a yellow-green emitting material layer including the yellow-green host and the yellow-green dopant.

22 Claims, 9 Drawing Sheets

(56) References Cited

U.S. PATENT DOCUMENTS

| | | | | |
|---|---|---|---|---|
| 2013/0264551 A1* | 10/2013 | Pieh | .................... | H01L 51/5056 |
| | | | | 257/40 |
| 2014/0167016 A1* | 6/2014 | Yoo | .................... | H01L 27/3209 |
| | | | | 257/40 |
| 2014/0183475 A1* | 7/2014 | Song | .................... | H01L 51/5278 |
| | | | | 257/40 |
| 2015/0001499 A1* | 1/2015 | Kim | .................... | H01L 51/5278 |
| | | | | 257/40 |
| 2015/0001506 A1* | 1/2015 | Kim | .................... | H01L 51/5044 |
| | | | | 257/40 |
| 2015/0034923 A1* | 2/2015 | Kim | .................... | H01L 27/3209 |
| | | | | 257/40 |
| 2016/0181563 A1* | 6/2016 | Cho | .................... | H01L 51/5024 |
| | | | | 257/40 |
| 2017/0125714 A1* | 5/2017 | Jung | .................... | H01L 51/504 |
| 2020/0203623 A1* | 6/2020 | Lee | .................... | C09K 11/025 |

* cited by examiner

ORGANIC LIGHT EMITTING DIODE DISPLAY DEVICE

CROSS REFERENCE TO RELATED APPLICATIONS

The present application claims the priority benefit of Korean Patent Application No. 10-2018-0143448 filed in Republic of Korea on Nov. 20, 2018, which is hereby incorporated by reference in its entirety for all purposes as if fully set forth herein.

BACKGROUND

Technical Field

The present disclosure relates to an organic light emitting diode display device, and more particularly, to an organic light emitting diode display device where a lifetime increases and a driving voltage decreases due to a red-yellow-green emitting material layer emitting a red colored light.

Description of the Related Art

Recently, a flat panel display (FPD) having a thin profile, a light weight and a low power consumption has been developed and applied to various fields.

In an organic light emitting diode (OLED) display device among flat panel displays, charges are injected into a light emitting layer between a cathode of an electron injecting electrode and an anode of a hole injecting electrode to form an exciton, and the exciton transitions from an excited state to a ground state to emit a light.

A white OLED display device used for a television may have a tandem structure including a plurality of stacks (emitting portions). The tandem structure has advantages in improvement of a driving voltage and an emission efficiency as compared with a single structure including one stack.

The white OLED display device may include a phosphorescent emitting material layer of a red emitting material layer, a yellow-green emitting material layer, a green emitting material layer. When the red emitting material layer has a relatively great thickness and a relatively high doping concentration, a green efficiency ratio and a white color coordinate deviate from target values and a color temperature decreases.

When the red emitting material layer is formed to have a relatively small thickness and a relatively low doping concentration to obtain a proper white color coordinate and proper red, green and blue efficiency ratios, a deterioration speed of the red emitting material layer and a driving voltage increase and a lifetime decreases.

BRIEF SUMMARY

Accordingly, the present disclosure is directed to an organic light emitting diode display device that substantially obviates one or more of the problems due to limitations and disadvantages of the related art.

In various embodiments, the present disclosure provides an organic light emitting diode display device where a proper white color coordinate and proper red, green and blue efficiency ratios are obtained, a lifetime increases and a driving voltage decreases due to a red-yellow-green emitting material layer emitting a red colored light.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with the present disclosure, as embodied and broadly described herein, an organic light emitting diode display device includes: a first electrode; a first stack on the first electrode, the first stack configured to emit a blue colored light; a first charge generating layer on the first stack; a second stack on the first charge generating layer, the second stack configured to emit a red colored light and a yellow-green colored light; and a second electrode on the second stack, wherein the second stack includes: a red-yellow-green emitting material layer including a yellow-green host, a yellow-green dopant and a red dopant; and a yellow-green emitting material layer including the yellow-green host and the yellow-green dopant.

It is to be understood that both the foregoing general description and the following detailed description are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
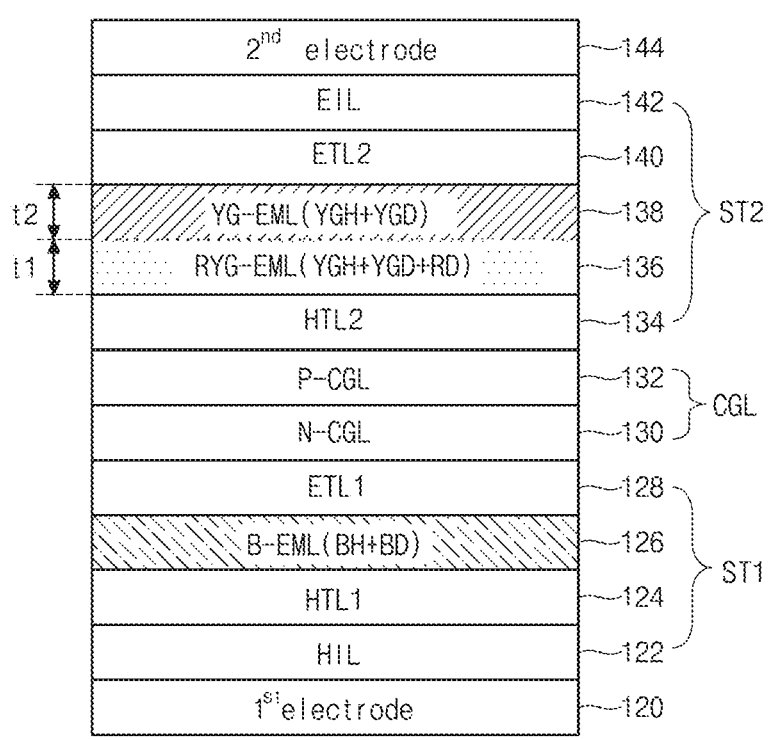
FIG. 1 is a cross-sectional view showing an organic light emitting diode display device according to a first embodiment of the present disclosure.

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just" or "direct(ly)," is used.

In describing a time relationship, when the temporal order is described as, for example, "after," "subsequent," "next," or "before," a case which is not continuous may be included unless a more limiting term, such as "just," "immediate(ly)," or "direct(ly)," is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" may be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Reference will now be made in detail to the present disclosure, examples of which are illustrated in the accompanying drawings.

FIG. 1 is a cross-sectional view showing an organic light emitting diode display device according to a first embodiment of the present disclosure.

In FIG. 1, an organic light emitting diode (OLED) display device 110 includes a first electrode 120, a first stack ST1, a charge generating layer CGL, a second stack ST2 and a second electrode 144.

The first and second electrodes 120 and 144 may be an anode and a cathode, respectively.

The first stack ST1 for emitting a first blue colored light may include a hole injecting layer (HIL) 122, a first hole transporting layer (HTL1) 124, a blue emitting material layer (B-EML) 126 and a first electron transporting layer (ETL1) 128.

The charge generating layer CGL may include a negative type charge generating layer (N-CGL) 130 and a positive type charge generating layer (P-CGL) 132.

The second stack ST2 for emitting a red colored light and a yellow-green colored light may include a second hole transporting layer (HTL2) 134, a red-yellow-green emitting material layer (RYG-EML) 136, a yellow-green emitting material layer (YG-EML) 138, a second electron transporting layer (ETL2) 140 and an electron injecting layer (EIL) 142.

Although not shown, the OLED display device 110 may further include a substrate having a plurality of sub-pixels each displaying red, green and blue colors. The first electrode 120 may be disposed in each of the plurality of sub-pixels on the substrate and the second electrode 144 may be disposed on a whole of the substrate.

A plurality of thin film transistors (TFTs) may be disposed in each of the plurality of sub-pixels under the first electrode 120, and the first electrode 120 may be connected to a driving TFT of the plurality of TFTs.

A color filter layer or a color converting layer may be disposed under the first electrode 120 or over the second electrode 144.

The hole injecting layer 122 may inject a hole, and the first and second hole transporting layers 124 and 134 may transport a hole. The first and second electron transporting layers 128 and 140 may transport an electron. The negative type charge generating layer 130 may generate an electron, and the positive type charge generating layer 132 may generate a hole.

The OLED display device 110 may emit a light not by using one stack including one emitting material but by using two stacks ST1 and ST2 including a plurality of emitting materials having photoluminescence peaks in different wavelengths. The OLED display device 110 may emit a white colored light by combining lights emitted from the first and second stacks ST1 and ST2.

The two stacks ST1 and ST2 may have a stack including a fluorescent emitting material and a stack including a phosphorescent emitting material. For example, the blue emitting material layer 126 of the first stack ST1 may include a fluorescent emitting material and the red-yellow-green emitting material layer 136 and the yellow-green emitting material layer 138 of the second stack ST2 may include a phosphorescent emitting material.

Each of the blue emitting material layer 126, the red-yellow-green emitting material layer 136 and the yellow-green emitting material layer 138 may include a host and a dopant.

For example, the blue emitting material layer 126 of the first stack ST1 may include a blue host (BH) and a blue dopant (BD).

Specifically, the red-yellow-green emitting material layer 136 of the second stack ST2 may include a yellow-green host (YGH), a yellow-green dopant (YGD) and a red dopant (RD) (YGH+YGD+RD), and the yellow-green emitting material layer 138 of the second stack ST2 may include a yellow-green host (YGH) and a yellow-green dopant (YGD) (YGH+YGD).

For example, the yellow-green host (YGH) may have one of a hole (H) type, an electron (E) type, or a combination of an H type and an E type. The H type host may be an organic material which is easily oxidized and has an electrochemical stable state when oxidized (e.g., a positive ion), and the E type host may be an organic material which is easily reduced and has an electrochemical stable state when reduced (e.g., a negative ion).

When the yellow-green host YGH has a combination of an H type and an E type (e.g., when a first portion of the yellow-green host YGH has the H type and a second portion of the yellow-green host has the E type), a portion of the red-yellow-green emitting material layer 136 and the yellow-green emitting material layer 138 adjacent to the second hole transporting layer 134 may include a yellow-green host (YGH) of an H type to improve a hole injecting property, and a portion of the red-yellow-green emitting material layer 136 and the yellow-green emitting material layer 138 adjacent to the second electron transporting layer 140 may include a yellow-green host (YGH) of an E type to improve an electron injecting property.

The yellow-green dopant (YGD) of the red-yellow-green emitting material layer 136 may have a concentration (a volume percentage) within a range of about 10% (v/v) to about 25% (v/v), and the red dopant (RD) of the red-yellow-green emitting material layer 136 may have a concentration (a volume percentage) within a range of about 1% (v/v) to about 5% (v/v). The yellow-green dopant (YGD) of the yellow-green emitting material layer 138 may have a concentration (a volume percentage) within a range of about 15% (v/v) to about 30% (v/v).

The red-yellow-green emitting material layer 136 may have a first thickness t1, and the yellow-green emitting material layer 138 may have a second thickness t2 substantially equal to or greater than the first thickness t1.

For example, the first thickness t1 may be within a range of about 100 Å to about 250 Å, and the second thickness t2 may be within a range of about 150 Å to about 300 Å.

In the OLED display device 110 according to the first embodiment of the present disclosure, the red-yellow-green emitting material layer 136 which includes the yellow-green host (YGH) having a relatively long lifetime and has a relatively great thickness is doped with the red dopant (RD) to emit a red colored light. As a result, a white color coordinate and red, green and blue efficiency ratios are maintained and a deterioration speed is reduced so that a lifetime can increase and a driving voltage can decrease.

In the red-yellow-green emitting material layer 136, an exciton generated in the yellow-green host (YGH) and the yellow-green dopant (YGD) is transferred to the red dopant (RD) so that the red colored light can be emitted.

Figure 2:
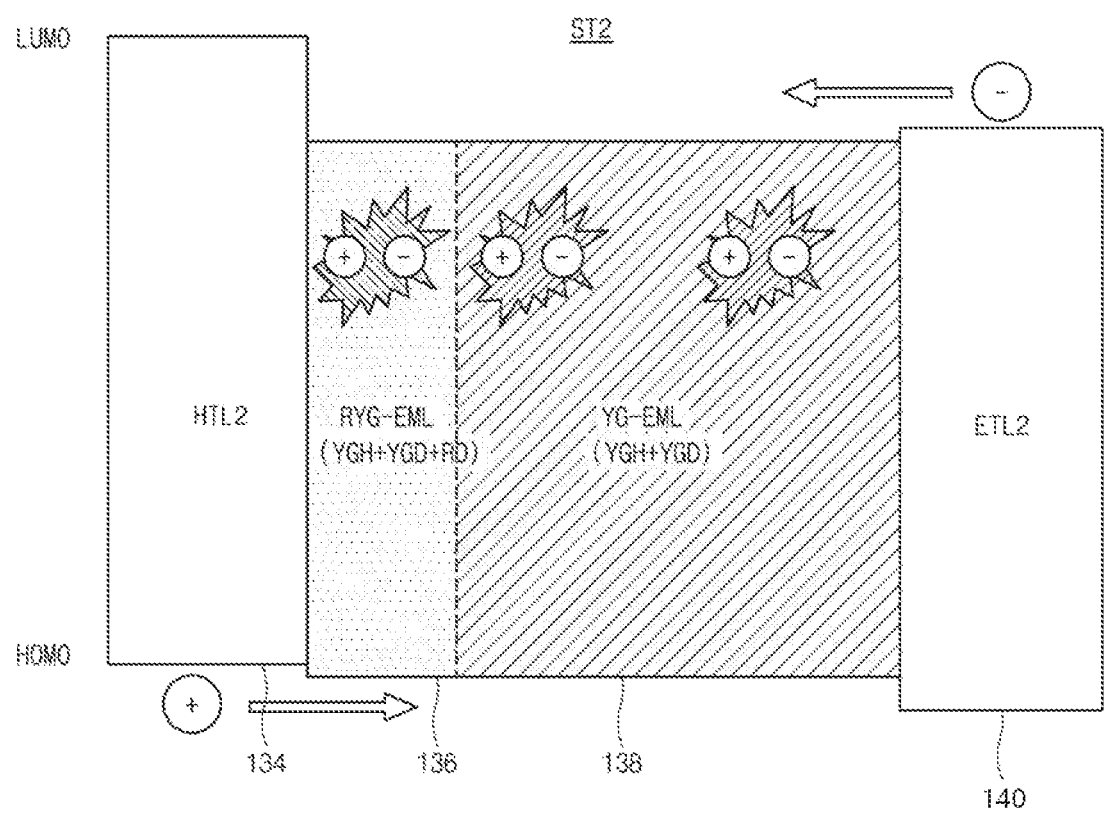
FIG. 2 is a view showing an energy band of a second stack of an organic light emitting diode display device according to a first embodiment of the present disclosure.
Figure 3:
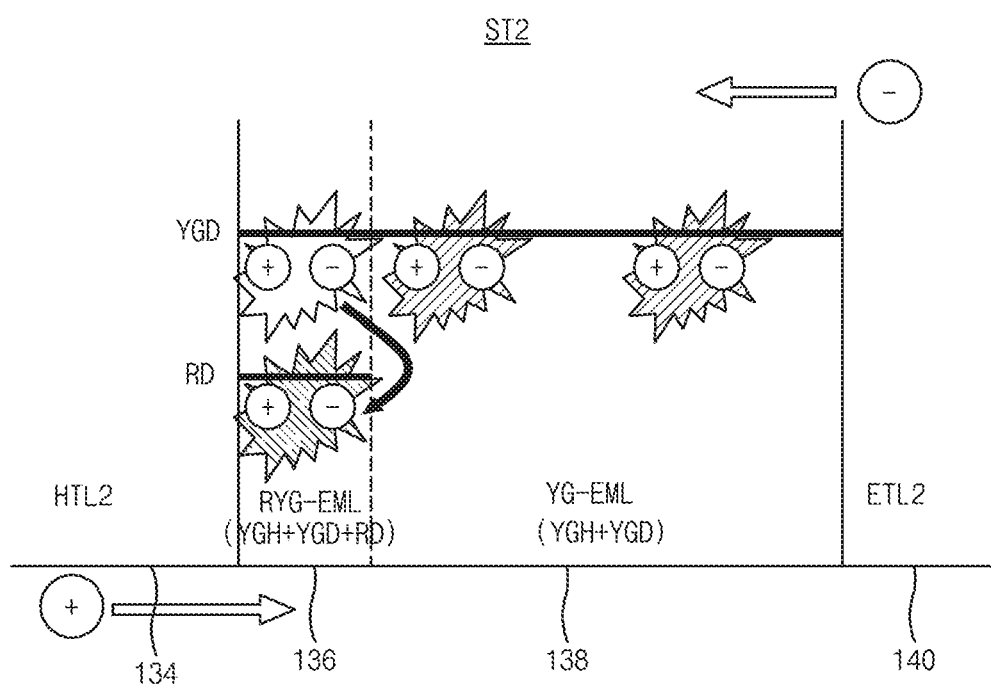
FIG. 3 is a view showing an emission principle of a second stack of an organic light emitting diode display device according to a first embodiment of the present disclosure.

FIG. 2 is a view showing an energy band of a second stack of an organic light emitting diode display device according to a first embodiment of the present disclosure, and FIG. 3 is a view showing an emission principle of a second stack of an organic light emitting diode display device according to a first embodiment of the present disclosure.

In FIG. 2, the second stack ST2 of the OLED display device 110 according to the first embodiment of the present disclosure includes the second hole transporting layer 134, the red-yellow-green emitting material layer 136, the yellow-green emitting material layer 138 and the second electron transporting layer 140. The red-yellow-green emitting material layer 136 may include the yellow-green host (YGH), the yellow-green dopant (YGD) and the red dopant (RD) (YGH+YGD+RD), and the yellow-green emitting material layer 138 may include the yellow-green host (YGH) and the yellow-green dopant (YGD) (YGH+YGD).

A highest occupied molecular orbital (HOMO) level of the second hole transporting layer 134 may be higher than a HOMO level of the yellow-green host (YGH) of the red-yellow-green emitting material layer 136, and a lowest unoccupied molecular orbital (LUMO) level of the second hole transporting layer 134 may be higher than a LUMO level of the yellow-green host (YGH) of the red-yellow-green emitting material layer 136. (A relatively low energy level corresponds to a relatively low position having a relatively great absolute value in an energy band diagram, and a relatively high energy level corresponds to a relatively high position having a relatively small absolute value in an energy band diagram.)

The HOMO level of the yellow-green host (YGH) of the red-yellow-green emitting material layer 136 may be substantially equal to the HOMO level of the yellow-green host (YGH) of the yellow-green emitting material layer 138, and the LUMO level of the yellow-green host (YGH) of the red-yellow-green emitting material layer 136 may be substantially equal to the LUMO level of the yellow-green host (YGH) of the yellow-green emitting material layer 138.

The HOMO level of the yellow-green host (YGH) of the yellow-green emitting material layer 138 may be higher than the HOMO level of the second electron transporting layer 140, and the LUMO level of the yellow-green host (YGH) of the yellow-green emitting material layer 138 may be lower than the LUMO level of the second electron transporting layer 140.

A hole and an electron are supplied to the red-yellow-green emitting material layer 136 and the yellow-green emitting material layer 138 from the second hole transporting layer 134 and the second electron transporting layer 140, respectively, to emit a red colored light and a yellow-green colored light.

In FIG. 3, an energy level of the yellow-green dopant (YGD) of the red-yellow-green emitting material layer 136 may be higher than an energy level of the red dopant (RD) of the red-yellow-green emitting material layer 136 and may be substantially equal to an energy level of the yellow-green dopant (YGD) of the yellow-green emitting material layer 138.

Accordingly, the hole and the electron supplied to the red-yellow-green emitting material layer 136 are combined in the yellow-green host (YGH) and the yellow-green dopant (YGD) to generate an exciton, and the exciton is transferred to the red dopant (RD) having an energy level lower than the yellow-green dopant (YGD) to emit a red colored light.

In addition, the hole and the electron supplied to the yellow-green emitting material layer 138 are combined in the yellow-green host (YGH) and the yellow-green dopant (YGD) to generate an exciton, and a yellow-green colored light having a wavelength shorter than the red colored light is emitted due to the yellow-green dopant (YGD) having an energy level higher than the red dopant (RD).

In the OLED display device 110 according to the first embodiment of the present disclosure, the red-yellow-green emitting material layer 136 which includes the yellow-green host (YGH) having a lifetime longer than the red host (RD) and has a thickness greater than the red emitting material layer is doped with the red dopant (RD) to emit a red colored light. As a result, a white color coordinate and red, green and blue efficiency ratios are maintained for target values and a deterioration speed is reduced so that a lifetime can increase. In addition, since the red emitting material layer is omitted, a driving voltage decreases.

In another embodiment, the OLED display device may include three stacks.

Figure 4:
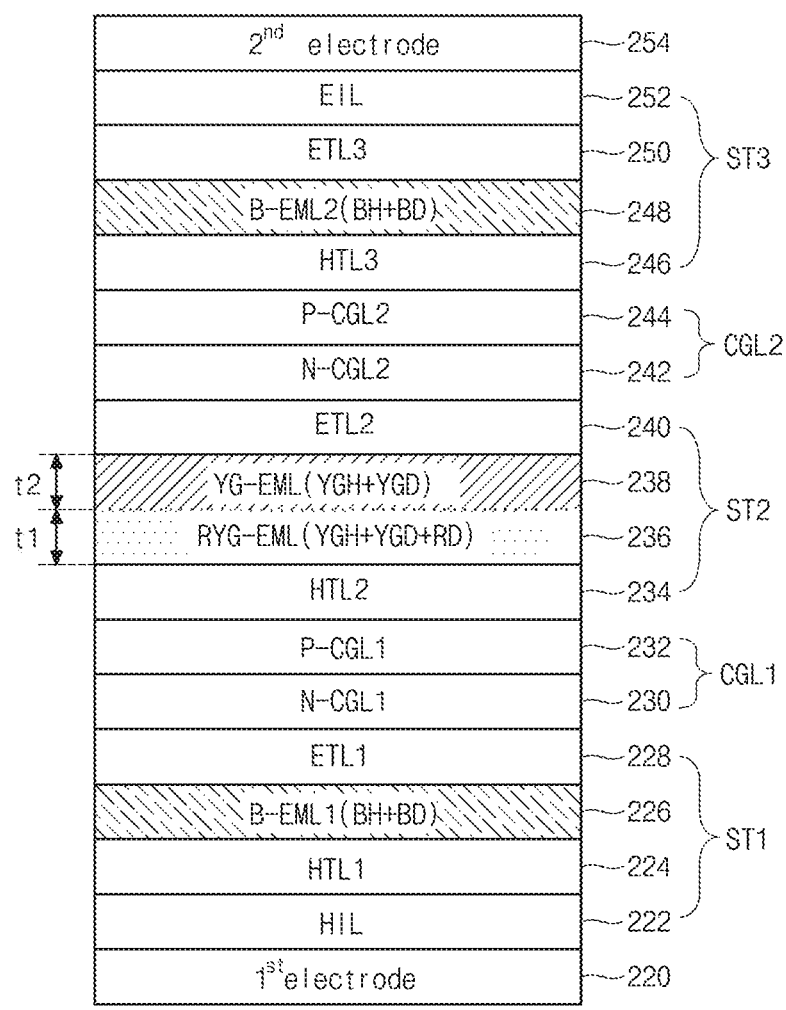
FIG. 4 is a cross-sectional view showing an organic light emitting diode display device according to a second embodiment of the present disclosure.

FIG. 4 is a cross-sectional view showing an organic light emitting diode display device according to a second embodiment of the present disclosure. Illustration for a part the same as the first embodiment will be omitted.

In FIG. 4, an organic light emitting diode (OLED) display device 210 according to a second embodiment of the present disclosure includes a first electrode 220, a first stack ST1, a first charge generating layer CGL1, a second stack ST2, a second charge generating layer CGL2, a third stack ST3 and a second electrode 254.

The first and second electrodes 220 and 254 may be an anode and a cathode, respectively.

The first stack ST1 for emitting a blue colored light may include a hole injecting layer (HIL) 222, a first hole transporting layer (HTL1) 224, a first blue emitting material layer (B-EML1) 226 and a first electron transporting layer (ETL1) 228.

The first charge generating layer CGL1 may include a first negative type charge generating layer (N-CGL1) 230 and a first positive type charge generating layer (P-CGL1) 232.

The second stack ST2 for emitting a red colored light and a yellow-green colored light may include a second hole transporting layer (HTL2) 234, a red-yellow-green emitting material layer (RYG-EML) 236, a yellow-green emitting material layer (YG-EML) 238 and a second electron transporting layer (ETL2) 240.

The second charge generating layer CGL2 may include a second negative type charge generating layer (N-CGL2) 242 and a second positive type charge generating layer (P-CGL2) 244.

The third stack ST3 for emitting a second blue colored light may include a third hole transporting layer (HTL3) 246, a second blue emitting material layer (B-EML2) 248, a third electron transporting layer (ETL3) 250 and an electron injecting layer (EIL) 252. The second blue colored light emitted by the third stack ST3 may be light having a same or a different blue color as the first blue color of light that is emitted by the first stack ST1.

Although not shown, the OLED display device 210 may further include a substrate having a plurality of sub-pixels each displaying red, green and blue colors. The first electrode 220 may be disposed in each of the plurality of sub-pixels on the substrate and the second electrode 254 may be disposed on a whole of the substrate.

A plurality of thin film transistors (TFTs) may be disposed in each of the plurality of sub-pixels under the first electrode 220, and the first electrode 220 may be connected to a driving TFT of the plurality of TFTs.

A color filter layer or a color converting layer may be disposed under the first electrode 220 or over the second electrode 254.

The hole injecting layer 222 may inject a hole, and the first, second and third hole transporting layers 224, 234 and 246 may transport a hole. The first, second and third electron transporting layers 228, 240 and 250 may transport an electron. The first and second negative type charge generating layers 230 and 242 may generate an electron, and the first and second positive type charge generating layers 232 and 244 may generate a hole.

The OLED display device 210 may emit a light not by using one stack including one emitting material but by using three stacks ST1, ST2 and ST3 including a plurality of emitting materials having photoluminescence peaks in different wavelengths. The OLED display device 210 may emit a white colored light by combining lights emitted from the first, second and third stacks ST1, ST2 and ST3.

The three stacks ST1, ST2 and ST3 may have a stack including a fluorescent emitting material and a stack including a phosphorescent emitting material. For example, the first blue emitting material layer 226 of the first stack ST1 may include a fluorescent emitting material, the red-yellow-green emitting material layer 236 and the yellow-green emitting material layer 238 of the second stack ST2 may include a phosphorescent emitting material, and the second blue emitting material layer 248 of the third stack ST3 may include a fluorescent emitting material.

Each of the first blue emitting material layer 226, the red-yellow-green emitting material layer 236, the yellow-green emitting material layer 238 and the second blue emitting material layer 248 may include a host and a dopant.

For example, each of the first blue emitting material layer 226 of the first stack ST1 and the second blue emitting material layer 248 of the third stack ST3 may include a blue host (BH) and a blue dopant (BD).

Specifically, the red-yellow-green emitting material layer 236 of the second stack ST2 may include a yellow-green host (YGH), a yellow-green dopant (YGD) and a red dopant (RD) (YGH+YGD+RD), and the yellow-green emitting material layer 238 of the second stack ST2 may include a yellow-green host (YGH) and a yellow-green dopant (YGD) (YGH+YGD).

For example, the yellow-green host (YGH) may have one of a hole (H) type, an electron (E) type and a combination type of an H type and an E type. The H type host may be an organic material which is easily oxidized and has an electrochemical stable state when oxidized (e.g., a positive ion), and the E type host may be an organic material which is easily reduced and has an electrochemical stable state when reduced (e.g., a negative ion).

When the yellow-green host (YGH) has a combination type of an H type and an E type, a portion of the red-yellow-green emitting material layer 236 and the yellow-green emitting material layer 238 adjacent to the second hole transporting layer 234 may include the yellow-green host (YGH) of an H type to improve a hole injecting property, and a portion of the red-yellow-green emitting material layer 236 and the yellow-green emitting material layer 238 adjacent to the second electron transporting layer 240 may include the yellow-green host (YGH) of an E type to improve an electron injecting property.

The yellow-green dopant (YGD) of the red-yellow-green emitting material layer 236 may have a concentration (a volume percentage) of about 10% (v/v) to about 25% (v/v), and the red dopant (RD) of the red-yellow-green emitting material layer 236 may have a concentration (a volume percentage) of about 1% (v/v) to about 5% (v/v). The yellow-green dopant (YGD) of the yellow-green emitting material layer 238 may have a concentration (a volume percentage) of about 15% (v/v) to about 30% (v/v).

The red-yellow-green emitting material layer 236 may have a first thickness t1, and the yellow-green emitting material layer 238 may have a second thickness t2 substantially equal to or greater than the first thickness t1.

For example, the first thickness t1 may be within a range of about 100 Å to about 250 Å, and the second thickness t2 may be within a range of about 150 Å to about 300 Å.

In the OLED display device 210 according to the second embodiment of the present disclosure, the red-yellow-green emitting material layer 236 which includes the yellow-green host (YGH) having a relatively long lifetime and has a relatively great thickness is doped with the red dopant (RD) to emit a red colored light. As a result, a white color coordinate and red, green and blue efficiency ratios are maintained and a deterioration speed is reduced so that a lifetime can increase and a driving voltage can decrease.

In another embodiment, the second stack of the OLED display device may include three layers.

Figure 5:
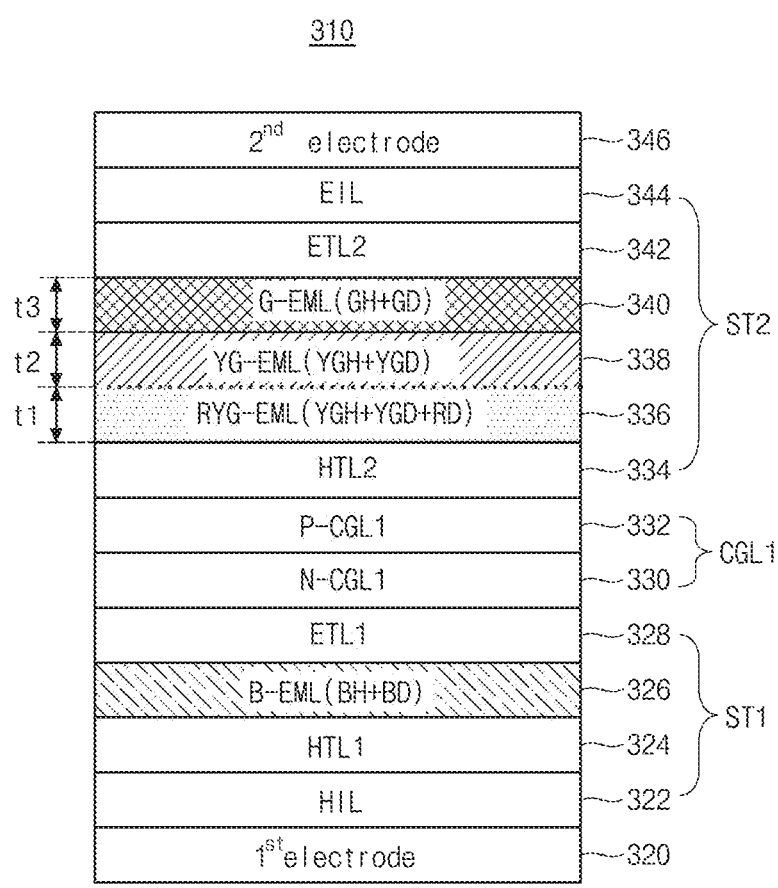
FIG. 5 is a cross-sectional view showing an organic light emitting diode display device according to a third embodiment of the present disclosure.

FIG. 5 is a cross-sectional view showing an organic light emitting diode display device according to a third embodiment of the present disclosure.

In FIG. 5, an organic light emitting diode (OLED) display device 310 includes a first electrode 320, a first stack ST1, a charge generating layer CGL, a second stack ST2 and a second electrode 346.

The first and second electrodes 320 and 346 may be an anode and a cathode, respectively.

The first stack ST1 for emitting a blue colored light may include a hole injecting layer (HIL) 322, a first hole transporting layer (HTL1) 324, a blue emitting material layer (B-EML) 326 and a first electron transporting layer (ETL1) 328.

The charge generating layer CGL may include a negative type charge generating layer (N-CGL) 330 and a positive type charge generating layer (P-CGL) 332.

The second stack ST2 for emitting a red colored light, a yellow-green colored light and a green colored light may include a second hole transporting layer (HTL2) 334, a red-yellow-green emitting material layer (RYG-EML) 336, a yellow-green emitting material layer (YG-EML) 338, a green emitting material layer (G-EML) 340, a second electron transporting layer (ETL2) 342 and a second electron transporting layer (ETL2) 344.

Although not shown, the OLED display device 310 may further include a substrate having a plurality of sub-pixels each displaying red, green and blue colors. The first electrode 320 may be disposed in each of the plurality of sub-pixels on the substrate and the second electrode 346 may be disposed on a whole of the substrate.

A plurality of thin film transistors (TFTs) may be disposed in each of the plurality of sub-pixels under the first electrode 320, and the first electrode 320 may be connected to a driving TFT of the plurality of TFTs.

A color filter layer or a color converting layer may be disposed under the first electrode 320 or over the second electrode 346.

The hole injecting layer 322 may inject a hole, and the first and second hole transporting layers 324 and 334 may transport a hole. The first and second electron transporting layers 328 and 342 may transport an electron. The negative type charge generating layer 330 may generate an electron, and the positive type charge generating layer 332 may generate a hole.

The OLED display device 310 may emit a light not by using one stack including one emitting material but by using two stacks ST1 and ST2 including a plurality of emitting materials having photoluminescence peaks in different wavelengths. The OLED display device 310 may emit a white colored light by combining lights emitted from the first and second stacks ST1 and ST2.

The two stacks ST1 and ST2 may have a stack including a fluorescent emitting material and a stack including a phosphorescent emitting material. For example, the blue emitting material layer 326 of the first stack ST1 may include a fluorescent emitting material, the red-yellow-green emitting material layer 336 and the yellow-green emitting material layer 338 and the green emitting material layer 340 of the second stack ST2 may include a phosphorescent emitting material.

Each of the blue emitting material layer 326, the red-yellow-green emitting material layer 336, the yellow-green emitting material layer 338 and the green emitting material layer 340 may include a host and a dopant.

For example, the blue emitting material layer 326 of the first stack ST1 may include a blue host (BH) and a blue dopant (BD).

Specifically, the red-yellow-green emitting material layer 336 of the second stack ST2 may include a yellow-green host (YGH), a yellow-green dopant (YGD) and a red dopant (RD) (YGH+YGD+RD), the yellow-green emitting material layer 338 of the second stack ST2 may include a yellow-green host (YGH) and a yellow-green dopant (YGD) (YGH+YGD), and the green emitting material layer 340 of the second stack ST2 may include a green host (GH) and a green dopant (GD) (GH+GD).

For example, each of the yellow-green host (YGH) and the green host (GH) may have one of a hole (H) type, an electron (E) type and a combination type of an H type and an E type. The H type host may be an organic material which is easily oxidized and has an electrochemical stable state when oxidized (e.g., a positive ion), and the E type host may be an organic material which is easily reduced and has an electrochemical stable state when reduced (e.g., a negative ion).

When each of the yellow-green host YGH and the green host (GH) has a combination type of an H type and an E type, a portion of the red-yellow-green emitting material layer 336, the yellow-green emitting material layer 338 and the green emitting material layer 340 adjacent to the second hole transporting layer 334 may include a yellow-green host (YGH) and a green host (GH) of an H type to improve a hole injecting property, and a portion of the red-yellow-green emitting material layer 336, the yellow-green emitting material layer 338 and the green emitting material layer 340 adjacent to the second electron transporting layer 342 may include a yellow-green host (YGH) and a green host (GH) of an E type to improve an electron injecting property.

The yellow-green dopant (YGD) of the red-yellow-green emitting material layer 336 may have a concentration (a volume percentage) within a range of about 10% (v/v) to about 25% (v/v), and the red dopant (RD) of the red-yellow-green emitting material layer 336 may have a concentration (a volume percentage) within a range of about 1% (v/v) to about 5% (v/v). The yellow-green dopant (YGD) of the yellow-green emitting material layer 338 may have a concentration (a volume percentage) within a range of about 15% (v/v) to about 30% (v/v), and the green dopant (GD) of the green emitting material layer 340 may have a concentration (a volume percentage) within a range of about 5% (v/v) to about 15% (v/v).

The red-yellow-green emitting material layer 336 may have a first thickness t1, the yellow-green emitting material layer 338 may have a second thickness t2 substantially equal to or greater than the first thickness t1, and the green emitting material layer 340 may have a third thickness t3 that is the same or substantially the same as the second thickness t2. (t1≤t2≈t3)

For example, the first thickness t1 may be within a range of about 50 Å to about 150 Å, the second thickness t2 may be within a range of about 100 Å to about 250 Å, and the third thickness t3 may be within a range of about 100 Å to about 250 Å.

In the third embodiment, for maximizing an emission efficiency, the second thickness t2 is greater than the first thickness t1 and the second and third thicknesses t2 and t3 are substantially the same as each other. In another embodiment, for improving a color reproducibility, the second thickness t2 may be smaller than the first thickness t1 and the first and third thicknesses t1 and t3 may be substantially the same as each other so that a total thickness of the red-yellow-green emitting material layer 336 and the yellow-green emitting material layer 338 can be maintained. (t2≤t1≈t3) For example, the first thickness t1 may be within a range of about 100 Å to about 250 Å, the second thickness t2 may be within a range of about 50 Å to about 150 Å, and the third thickness t3 may be within a range of about 100 Å to about 250 Å.

In the OLED display device 310 according to the third embodiment of the present disclosure, the red-yellow-green emitting material layer 336 which includes the yellow-green host (YGH) having a relatively long lifetime and has a relatively great thickness is doped with the red dopant (RD) to emit a red colored light. As a result, a white color coordinate and red, green and blue efficiency ratios are maintained and a deterioration speed is reduced so that a lifetime can increase and a driving voltage can decrease.

In the red-yellow-green emitting material layer 336, the exciton generated in the yellow-green host (YGH) and the yellow-green dopant (YGD) is transferred to the red dopant (RD) to emit the red colored light.

Figure 6:
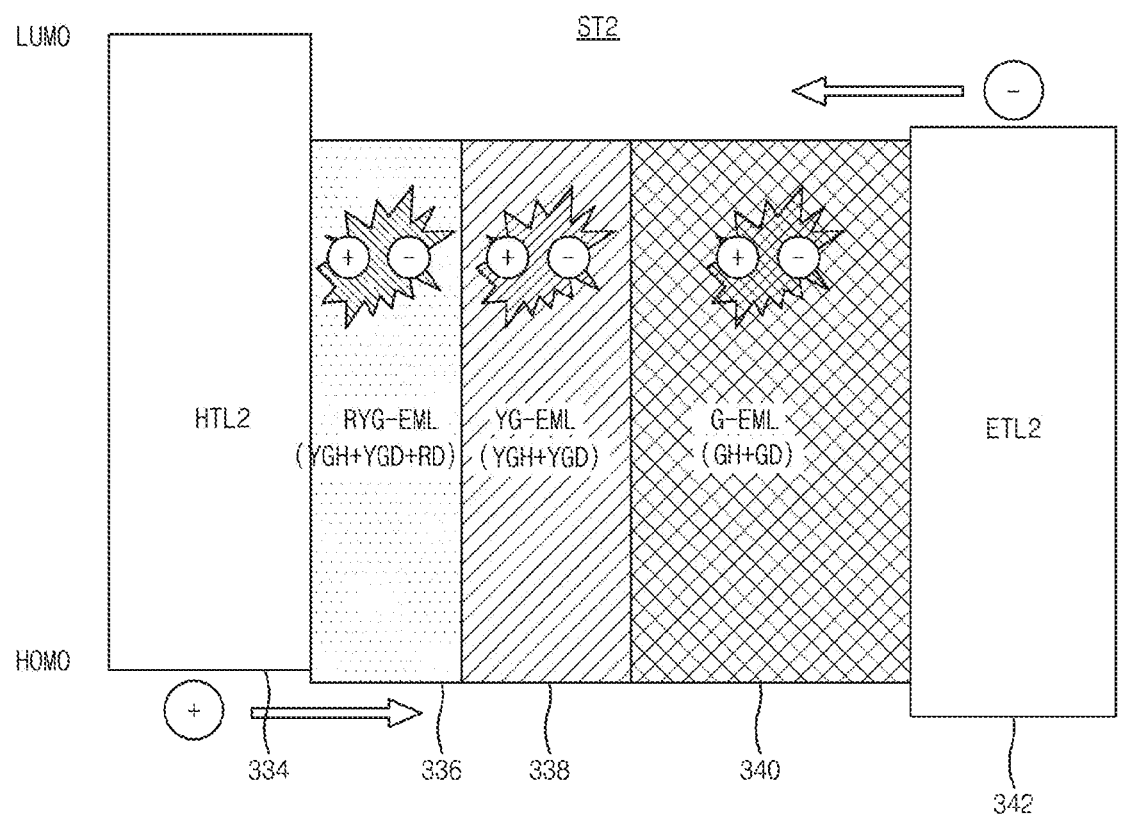
FIG. 6 is a view showing an energy band of a second stack of an organic light emitting diode display device according to a third embodiment of the present disclosure.
Figure 7:
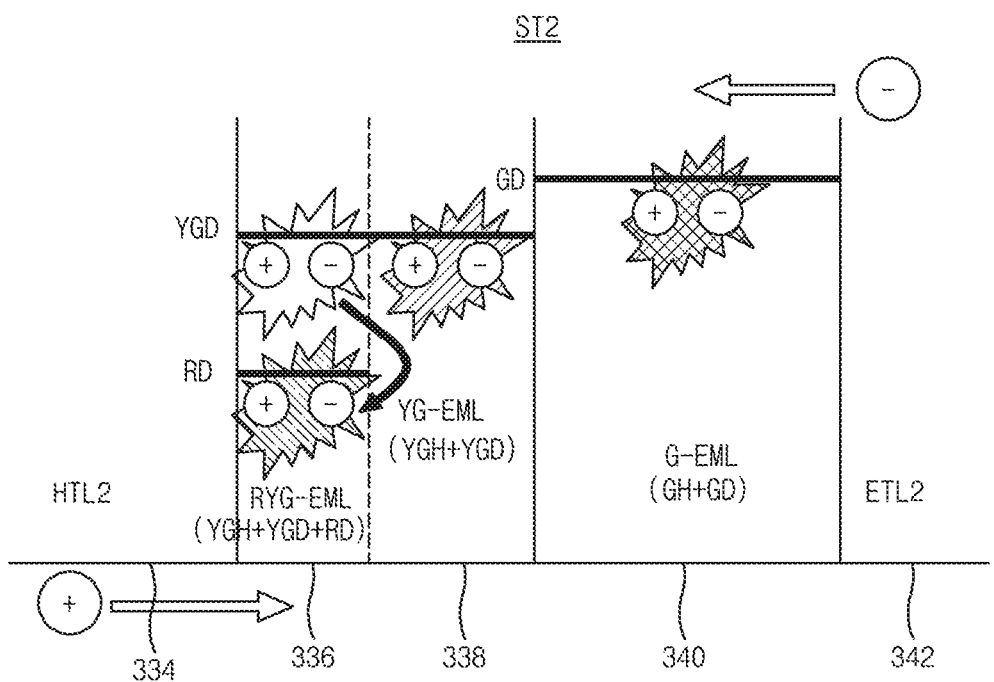
FIG. 7 is a view showing an emission principle of a second stack of an organic light emitting diode display device according to a third embodiment of the present disclosure.

FIG. 6 is a view showing an energy band of a second stack of an organic light emitting diode display device according to a third embodiment of the present disclosure, and FIG. 7 is a view showing an emission principle of a second stack of an organic light emitting diode display device according to a third embodiment of the present disclosure.

In FIG. 6, the second stack ST2 of the OLED display device 310 according to the third embodiment of the present disclosure includes the second hole transporting layer 334, the red-yellow-green emitting material layer 336, the yellow-green emitting material layer 338, the green emitting material layer 340 and the second electron transporting layer 342. The red-yellow-green emitting material layer 336 may include the yellow-green host (YGH), the yellow-green dopant (YGD) and the red dopant (RD) (YGH+YGD+RD), the yellow-green emitting material layer 338 may include the yellow-green host (YGH) and the yellow-green dopant (YGD) (YGH+YGD), and the green emitting material layer 340 may include the green host (GH) and the green dopant (GD) (GH+GD).

A highest occupied molecular orbital (HOMO) level of the second hole transporting layer 334 may be higher than a HOMO level of the yellow-green host (YGH) of the red-yellow-green emitting material layer 336, and a lowest unoccupied molecular orbital (LUMO) level of the second hole transporting layer 334 may be higher than a LUMO level of the yellow-green host (YGH) of the red-yellow-green emitting material layer 336. (A relatively low energy level corresponds to a relatively low position having a relatively great absolute value in an energy band diagram, and a relatively high energy level corresponds to a relatively high position having a relatively small absolute value in an energy band diagram.)

The HOMO level of the yellow-green host (YGH) of the red-yellow-green emitting material layer 336 may be substantially equal to the HOMO level of the yellow-green host (YGH) of the yellow-green emitting material layer 338, and the LUMO level of the yellow-green host (YGH) of the red-yellow-green emitting material layer 336 may be substantially equal to the LUMO level of the yellow-green host (YGH) of the yellow-green emitting material layer 338.

The HOMO level of the yellow-green host (YGH) of the yellow-green emitting material layer 338 may be substantially the same as the HOMO level of the green host (GH) of the green emitting material layer 340, and the LUMO level of the yellow-green host (YGH) of the yellow-green emitting material layer 338 may be substantially the same as the LUMO level of the green host (GH) of the green emitting material layer 340.

The HOMO level of the green host (GH) of the green emitting material layer 340 may be higher than the HOMO level of the second electron transporting layer 342, and the LUMO level of the green host (GH) of the green emitting material layer 340 may be lower than the LUMO level of the second electron transporting layer 342.

A hole and an electron are supplied to the red-yellow-green emitting material layer 336, the yellow-green emitting material layer 338 and the green emitting material layer 340 from the second hole transporting layer 334 and the second electron transporting layer 342, respectively, to emit a red colored light, a yellow-green colored light and a green colored light.

In FIG. 7, an energy level of the yellow-green dopant (YGD) of the red-yellow-green emitting material layer 336 may be higher than an energy level of the red dopant (RD) of the red-yellow-green emitting material layer 336, may be substantially equal to an energy level of the yellow-green dopant (YGD) of the yellow-green emitting material layer 338, and may be lower than an energy level of the green dopant (GD) of the green emitting material layer 340.

Accordingly, the hole and the electron supplied to the red-yellow-green emitting material layer 336 are combined in the yellow-green host (YGH) and the yellow-green dopant (YGD) to generate an exciton, and the exciton is transferred to the red dopant (RD) having an energy level lower than the yellow-green dopant (YGD) to emit a red colored light.

In addition, the hole and the electron supplied to the yellow-green emitting material layer 338 are combined in the yellow-green host (YGH) and the yellow-green dopant (YGD) to generate an exciton, and a yellow-green colored light having a wavelength shorter than the red colored light is emitted due to the yellow-green dopant (YGD) having an energy level higher than the red dopant (RD).

Further, the hole and the electron supplied to the green emitting material layer 340 are combined in the green host (GH) and the green dopant (GD) to generate an exciton, and a green colored light having a wavelength shorter than the yellow-green colored light is emitted due to the green dopant (GD) having an energy level higher than the yellow-green dopant (YGD).

In the OLED display device 310 according to the third embodiment of the present disclosure, the red-yellow-green emitting material layer 336 which includes the yellow-green host (YGH) having a lifetime longer than the red host (RD) and has a thickness greater than the red emitting material layer is doped with the red dopant (RD) to emit a red colored light. As a result, a white color coordinate and red, green and blue efficiency ratios are maintained for target values and a deterioration speed is reduced so that a lifetime can increase. In addition, since the red emitting material layer is omitted, a driving voltage decreases.

Figure 8:
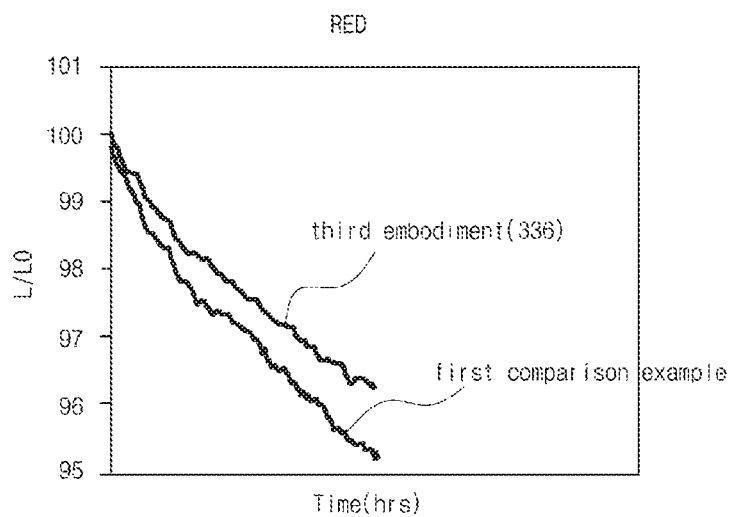
FIG. 8 is a view showing a luminance of a red-yellow-green emitting material layer of an organic light emitting diode display device according to a third embodiment of the present disclosure.
Figure 9:
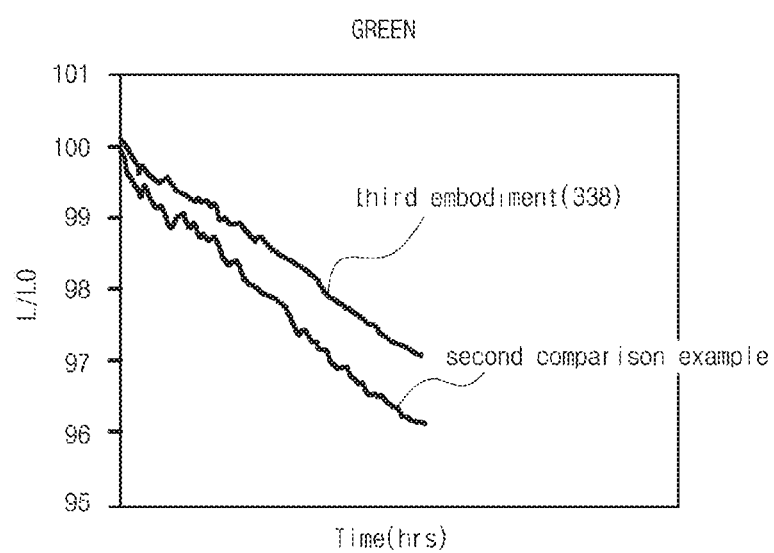
FIG. 9 is a view showing a luminance of a yellow-green emitting material layer of an organic light emitting diode display device according to a third embodiment of the present disclosure.

FIG. 8 is a view showing a luminance of a red-yellow-green emitting material layer of an organic light emitting diode display device according to a third embodiment of the present disclosure, and FIG. 9 is a view showing a luminance of a yellow-green emitting material layer of an organic light emitting diode display device according to a third embodiment of the present disclosure.

In FIG. 8, since the red-yellow-green emitting material layer 336 of the OLED display device 310 according to the third embodiment of the present disclosure includes the yellow-green host (YGH) instead of a red host, the red-yellow-green emitting material layer 336 has a slower deterioration speed as compared with a red emitting material layer including a red host and a red dopant of a first comparison example. As a result, the lifetime of a layer emitting the red colored light increases.

For example, a lifetime of the red-yellow-green emitting material layer 336 of the third embodiment may be about 130% of a lifetime (100%) of the red emitting material layer of the first comparison example.

In FIG. 9, since the deterioration speed of the red-yellow-green emitting material layer 336 is reduced, a loss of an exciton due to the adjacent layer is reduced in the yellow-green emitting material layer 338 of the OLED display device 310 according to the third embodiment of the present disclosure. Accordingly, the yellow-green emitting material layer 338 has a slower deterioration speed as compared with a yellow-green emitting material layer including a yellow-green host and a yellow-green dopant of a second comparison example. As a result, the lifetime of a layer emitting the yellow-green colored light increases.

For example, a lifetime of the yellow-green emitting material layer 338 of the third embodiment may be about 130% of a lifetime (100%) of the yellow-green emitting material layer of the second comparison example.

Further, the light emitting layer of the third embodiment may have a driving voltage of about 4.25V, which is reduced by about 0.15V as compared with a driving voltage of about 4.40V of a light emitting layer of the second comparison example.

In another embodiment, the OLED display device may include three stacks and the second stack may include three layers.

Figure 10:
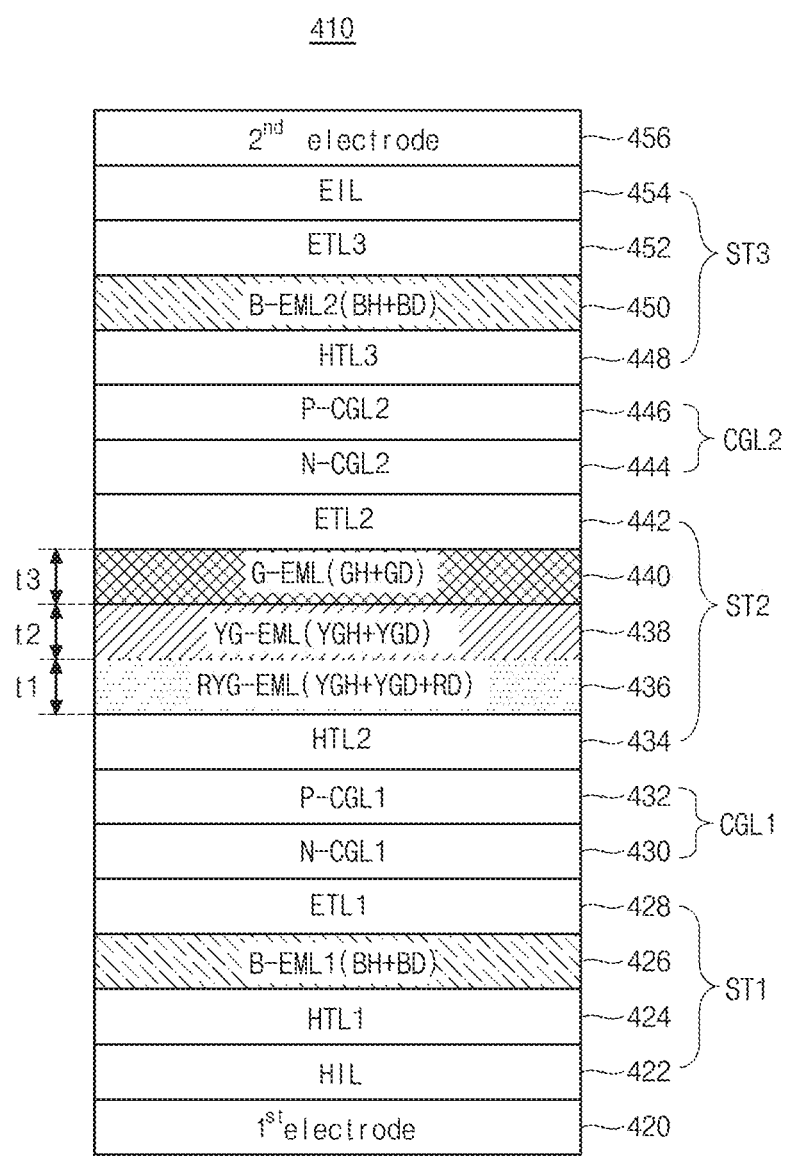
FIG. 10 is a cross-sectional view showing an organic light emitting diode display device according to a fourth embodiment of the present disclosure.

FIG. 10 is a cross-sectional view showing an organic light emitting diode display device according to a fourth embodiment of the present disclosure. Illustration for a part the same as the first and third embodiments will be omitted.

In FIG. 10, an organic light emitting diode (OLED) display device 410 according to a fourth embodiment of the present disclosure includes a first electrode 420, a first stack ST1, a first charge generating layer CGL1, a second stack ST2, a second charge generating layer CGL2, a third stack ST3 and a second electrode 456.

The first and second electrodes 420 and 456 may be an anode and a cathode, respectively.

The first stack ST1 for emitting a blue colored light may include a hole injecting layer (HIL) 422, a first hole transporting layer (HTL1) 424, a first blue emitting material layer (B-EML1) 426 and a first electron transporting layer (ETL1) 428.

The first charge generating layer CGL1 may include a first negative type charge generating layer (N-CGL1) 430 and a first positive type charge generating layer (P-CGL1) 432.

The second stack ST2 for emitting a red colored light and a yellow-green colored light may include a second hole transporting layer (HTL2) 434, a red-yellow-green emitting material layer (RYG-EML) 436, a yellow-green emitting material layer (YG-EML) 438, a green emitting material layer (G-EML) 440 and a second electron transporting layer (ETL2) 442.

The second charge generating layer CGL2 may include a second negative type charge generating layer (N-CGL2) 444 and a second positive type charge generating layer (P-CGL2) 446.

The third stack ST3 for emitting a blue colored light may include a third hole transporting layer (HTL3) 448, a second blue emitting material layer (B-EML2) 450, a third electron transporting layer (ETL3) 452 and an electron injecting layer (EIL) 454.

Although not shown, the OLED display device 410 may further include a substrate having a plurality of sub-pixels each displaying red, green and blue colors. The first electrode 420 may be disposed in each of the plurality of sub-pixels on the substrate and the second electrode 456 may be disposed on a whole of the substrate.

A plurality of thin film transistors (TFTs) may be disposed in each of the plurality of sub-pixels under the first electrode 420, and the first electrode 420 may be connected to a driving TFT of the plurality of TFTs.

A color filter layer or a color converting layer may be disposed under the first electrode 420 or over the second electrode 456.

The hole injecting layer 422 may inject a hole, and the first, second and third hole transporting layers 424, 434 and 448 may transport a hole. The first, second and third electron transporting layers 428, 442 and 452 may transport an electron. The first and second negative type charge generating layers 430 and 444 may generate an electron, and the first and second positive type charge generating layers 432 and 446 may generate a hole.

The OLED display device 410 may emit a light not by using one stack including one emitting material but by using three stacks ST1, ST2 and ST3 including a plurality of emitting materials having photoluminescence peaks in different wavelengths. The OLED display device 410 may emit a white colored light by combining lights emitted from the first, second and third stacks ST1, ST2 and ST3.

The three stacks ST1, ST2 and ST3 may have a stack including a fluorescent emitting material and a stack including a phosphorescent emitting material. For example, the first blue emitting material layer 426 of the first stack ST1 may include a fluorescent emitting material, the red-yellow-green emitting material layer 436, the yellow-green emitting material layer 438 and the green emitting material layer 440 of the second stack ST2 may include a phosphorescent emitting material, and the second blue emitting material layer 450 of the third stack ST3 may include a fluorescent emitting material.

Each of the first blue emitting material layer 426, the red-yellow-green emitting material layer 436, the yellow-green emitting material layer 438, the green emitting material layer 440 and the second blue emitting material layer 450 may include a host and a dopant.

For example, each of the first blue emitting material layer 426 of the first stack ST1 and the second blue emitting material layer 450 of the third stack ST3 may include a blue host (BH) and a blue dopant (BD).

Specifically, the red-yellow-green emitting material layer 436 of the second stack ST2 may include a yellow-green host (YGH), a yellow-green dopant (YGD) and a red dopant (RD) (YGH+YGD+RD), the yellow-green emitting material layer 438 of the second stack ST2 may include a yellow-green host (YGH) and a yellow-green dopant (YGD) (YGH+YGD), and the green emitting material layer 440 of the second stack ST2 may include a green host (GH) and a green dopant (GD) (GH+GD).

For example, the yellow-green host (YGH) may have one of a hole (H) type, an electron (E) type, or a combination type of an H type and an E type. The H type host may be an organic material which is easily oxidized and has an electrochemical stable state when oxidized (e.g., a positive ion), and the E type host may be an organic material which is easily reduced and has an electrochemical stable state when reduced (e.g., a negative ion).

When each of the yellow-green host (YGH) and the green host (GH) has a combination type of an H type and an E type, a portion of the red-yellow-green emitting material layer 436, the yellow-green emitting material layer 438 and the green emitting material layer 440 adjacent to the second hole transporting layer 434 may include the yellow-green host (YGH) and the green host (GH) of an H type to improve a hole injecting property, and a portion of the red-yellow-green emitting material layer 436, the yellow-green emitting material layer 438 and the green emitting material layer 440 adjacent to the second electron transporting layer 442 may include the yellow-green host (YGH) and the green host (GH) of an E type to improve an electron injecting property.

The yellow-green dopant (YGD) of the red-yellow-green emitting material layer 436 may have a concentration (a volume percentage) within a range of about 10% (v/v) to about 25% (v/v), and the red dopant (RD) of the red-yellow-green emitting material layer 436 may have a concentration (a volume percentage) within a range of about 1% (v/v) to about 5% (v/v). The yellow-green dopant (YGD) of the yellow-green emitting material layer 438 may have a concentration (a volume percentage) within a range of about 15% (v/v) to about 30% (v/v), and the green dopant (GD) of the green emitting material layer 440 may have a concentration (a volume percentage) within a range of about 5% (v/v) to about 15% (v/v).

The red-yellow-green emitting material layer 436 may have a first thickness t1, the yellow-green emitting material layer 438 may have a second thickness t2 substantially equal to or greater than the first thickness t1, and the green emitting material layer 440 may have a third thickness t3 substantially the same as the second thickness t2. (t1≤t2≈t3)

For example, the first thickness t1 may be within a range of about 50 Å to about 150 Å, the second thickness t2 may be within a range of about 100 Å to about 250 Å, and the third thickness t3 may be within a range of about 100 Å to about 250 Å.

In the fourth embodiment, for maximizing an emission efficiency, the second thickness t2 is greater than the first thickness t1 and the second and third thicknesses t2 and t3 are substantially the same as each other. In another embodiment, for improving a color reproducibility, the second thickness t2 may be smaller than the first thickness t1 and the first and third thicknesses t1 and t3 may be substantially the same as each other so that a total thickness of the red-yellow-green emitting material layer 436 and the yellow-green emitting material layer 438 can be maintained. (t2≤t1≈t3) For example, the first thickness t1 may be within a range of about 100 Å to about 250 Å, the second thickness t2 may be within a range of about 50 Å to about 150 Å, and the third thickness t3 may be within a range of about 100 Å to about 250 Å.

In the OLED display device 410 according to the fourth embodiment of the present disclosure, the red-yellow-green emitting material layer 436 which includes the yellow-green host (YGH) having a relatively long lifetime and has a relatively great thickness is doped with the red dopant (RD) to emit a red colored light. As a result, a white color coordinate and red, green and blue efficiency ratios are maintained and a deterioration speed is reduced so that a lifetime can increase and a driving voltage can decrease.

In the first to fourth embodiments, the OLED display device has a bottom emission type where the second electrode functions as a reflector, and the red-yellow-green emitting material layer (RYG-EML) doped with the yellow-green dopant (YGD) and the red dopant (RD) is disposed under the yellow-green emitting material layer (YG-EML) doped with the yellow-green dopant (YGD). In another embodiment, the OLED display device may have a top emission type where the first electrode functions as a reflector, and the red-yellow-green emitting material layer (RYG-EML) doped with the yellow-green dopant (YGD) and the red dopant (RD) is disposed over the yellow-green emitting material layer (YG-EML) doped with the yellow-green dopant (YGD).

Consequently, in the present disclosure, since a red-yellow-green emitting material layer including a red dopant emits a red colored light, a white color coordinate and red, green and blue efficiency ratios are maintained for target values. In addition, a lifetime can increase and a driving voltage decreases.

It will be apparent to those skilled in the art that various modifications and variation can be made in the present disclosure without departing from the spirit or scope of the disclosure. Thus, it is intended that the present disclosure cover the modifications and variations of this disclosure provided they come within the scope of the appended claims and their equivalents.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light emitting diode display device, comprising:
   a first electrode;
   a first stack on the first electrode, the first stack configured to emit a first blue colored light;
   a first charge generating layer on the first stack;
   a second stack on the first charge generating layer, the second stack configured to emit a red colored light and a yellow-green colored light; and
   a second electrode on the second stack,
   wherein the second stack comprises:
      a red-yellow-green emitting material layer including a yellow-green host, a yellow-green dopant and a red dopant; and
      a yellow-green emitting material layer including the yellow-green host and the yellow-green dopant.

2. The device of claim 1, wherein the red-yellow-green emitting material layer is configured to emit the red colored light, and the yellow-green emitting material layer is configured to emit the yellow-green colored light.

3. The device of claim 1, wherein a concentration of the yellow-green dopant in the red-yellow-green emitting layer is within a range of 10% (v/v) to 25% (v/v),
   a concentration of the red dopant in the red-yellow-green emitting layer is within a range of 1% (v/v) to 5% (v/v), and
   a concentration of the yellow-green dopant in the yellow-green emitting layer is within a range of 15% (v/v) to 30% (v/v).

4. The device of claim 1, wherein a first thickness of the red-yellow-green emitting material layer is substantially equal to or less than a second thickness of the yellow-green emitting material layer.

5. The device of claim 4, where the first thickness is within a range of 100 Å to 250 Å, and the second thickness is within a range of 150 Å to 300 Å.

6. The device of claim 1, wherein the red-yellow-green emitting material layer is disposed between the first stack and the yellow-green emitting material layer.

7. The device of claim 6, wherein the red-yellow-green emitting material layer and the yellow-green emitting material layer directly contact each other.

8. The device of claim 1, wherein the second stack further comprises a green emitting material layer including a green dopant.

9. The device of claim 8, wherein the green emitting material layer is disposed between the yellow-green emitting material layer and the second electrode.

10. The device of claim 9, wherein the green emitting material layer and the yellow-green emitting material layer directly contact each other.

11. The device of claim 8, wherein a concentration of the yellow-green dopant in the red-yellow-green emitting material layer is within a range of 10% (v/v) to 25% (v/v),
    a concentration of the red dopant in the red-yellow-green emitting material layer is within a range of 1% (v/v) to 5% (v/v),
    a concentration of the yellow-green dopant in the yellow-green emitting material layer is within a range of 15% (v/v) to 30% (v/v), and
    a concentration of the green dopant in the green emitting material layer is within a range of 5% (v/v) to 15% (v/v).

12. The device of claim 8, wherein a first thickness of the red-yellow-green emitting material layer is substantially equal to or less than a second thickness of the yellow-green emitting material layer, and
    wherein the first thickness of the red-yellow-green emitting material layer is substantially equal to or less than a third thickness of the green emitting material layer.

13. The device of claim 12, wherein the third thickness of the green emitting material layer is substantially equal to the second thickness of the yellow-green emitting material layer.

14. The device of claim 12, wherein the first thickness is within a range of 50 Å to 150 Å, the second thickness is within a range of 100 Å to 150 Å, and the third thickness is within a range of 100 Å to 250 Å.

15. The device of claim 8, wherein a first thickness of the red-yellow-green emitting material layer is substantially equal to or greater than a second thickness of the yellow-green emitting material layer, and
    wherein the third thickness of the green emitting material layer is substantially equal to or greater than the second thickness of the yellow-green emitting material layer.

16. The device of claim 15, wherein the first thickness of the red-yellow-green emitting material layer is substantially equal to a third thickness of the green emitting material layer.

17. The device of claim 15, where the first thickness is within a range of 100 Å to 250 Å, the second thickness is within a range of 50 Å to 150 Å, and the third thickness is within a range of 100 Å to 250 Å.

18. The device of claim 1, further comprising:
    a second charge generating layer between the second stack and the second electrode; and
    a third stack between the second charge generating layer and the second electrode, the third stack configured to emit a second blue colored light.

19. The device of claim 18, wherein the second stack further comprises a green emitting material layer including a green dopant.

20. The device of claim 19 wherein the green emitting layer is disposed between the yellow-green emitting material layer and the third stack.

21. The device of claim 1, wherein the first stack comprises:
    a hole injecting layer on the first electrode;
    a first hole transporting layer on the hole injecting layer;
    a blue emitting material layer on the first hole transporting layer, the blue emitting material layer configured to emit the blue colored light; and a first electron transporting layer on the blue emitting material layer, wherein the second stack further comprises:
a second hole transporting layer on the first charge generating layer;
a second electron transporting layer on the red-yellow-green emitting material layer and the yellow-green emitting material layer; and
an electron injecting layer on the second electron transporting layer.

22. The device of claim 21, wherein the yellow-green host of the red-yellow-green emitting material layer and the yellow-green emitting material layer includes a first portion of the yellow-green host of a hole type and a second portion of the yellow-green host of an electron type, and wherein the first portion of the yellow-green host of the hole type is disposed in a portion of the red-yellow-green emitting material layer and the yellow-green emitting material layer adjacent to the second hole transporting layer, and the second portion of the yellow-green host of the electron type is disposed in a portion of the red-yellow-green emitting material layer and the yellow-green emitting material layer adjacent to the second electron transporting layer.

* * * * *